(12) United States Patent
Ohira

(10) Patent No.: US 7,639,049 B2
(45) Date of Patent: *Dec. 29, 2009

(54) VOLTAGE DETECTING CIRCUIT AND BATTERY DEVICE USING SAME

(75) Inventor: Masanori Ohira, Kyoto (JP)

(73) Assignee: Rohm Co. Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/244,810

(22) Filed: Oct. 3, 2008

(65) Prior Publication Data
US 2009/0039921 A1 Feb. 12, 2009

Related U.S. Application Data

(63) Continuation of application No. 10/598,279, filed as application No. PCT/JP2005/002273 on Feb. 15, 2005, now Pat. No. 7,446,574.

(30) Foreign Application Priority Data
Feb. 23, 2004 (JP) .............................. 2004-045739

(51) Int. Cl.
H03K 5/153 (2006.01)
(52) U.S. Cl. .......................... 327/73; 327/64; 327/206

(58) Field of Classification Search ............. 327/63–65, 327/67–70, 72, 73, 77, 205, 206
See application file for complete search history.

(56) References Cited

OTHER PUBLICATIONS

Ohira: "Voltage Detecting Circuit and Battery Device Using Same," U.S. Appl. No. 10/598,279, filed Aug. 23, 2006.

Primary Examiner—Lincoln Donovan
Assistant Examiner—William Hernandez
(74) Attorney, Agent, or Firm—Keating and Bennett, LLP

(57) ABSTRACT

A voltage detecting circuit included in a battery device includes an input voltage comparing circuit that compares a first threshold value voltage or a second threshold value voltage lower than the first threshold value voltage with an input voltage to control the opening and closing of an output switching element, and a threshold value voltage setting circuit that compares a third threshold value voltage lower than the second threshold value voltage with the input voltage and, when the input voltage changes from a low voltage to a high voltage and intersects the third threshold value voltage, outputs a pulse for a predetermined period thereafter so that the second threshold value is selected in the input voltage comparing circuit. As a result, when the input voltage increases from the ground potential, the second threshold value is compared with the input voltage in the input voltage comparing circuit. The voltage detecting circuit and battery device using the circuit, when assembled in battery using equipment, uses a battery up to its usage limit.

4 Claims, 3 Drawing Sheets

VOLTAGE DETECTING CIRCUIT AND BATTERY DEVICE USING SAME

BACKGROUND OF THE INVENTION

1. Field of the Invention

The present invention relates to a voltage detecting circuit for detecting the voltage of a battery or other similar device and outputting a signal that indicates whether the voltage is high or low with respect to a predetermined voltage, and to a battery device suitable for battery using equipment that is able to fully utilize the potential of the battery.

2. Description of the Related Art

Japanese Patent Application Laid-Open No. H11-258280 discloses one example of a known conventional voltage detecting circuit and battery device using this circuit. FIG. 4 of this example shows a voltage detecting circuit 102 and a battery device 101 using this circuit. A battery device 101 includes a voltage detecting circuit 102; series-connected resistors 104, 105, having one end grounded and for generating an input voltage $V_{BAT}$ of the voltage detecting circuit 102; and a battery 103 connected to the other end of the series-connected resistors 104, 105 that serves as the power source of a battery using equipment. The voltage of the battery 103 is divided by the series-connected resistors 104, 105, and this divided voltage is input into the voltage detecting circuit 102 as an input voltage $V_{BAT}$. The voltage detecting circuit 102 compares the input voltage $V_{BAT}$ with a detection threshold value voltage $V_{TH}$. When the input voltage $V_{BAT}$ is higher than the detection threshold value voltage $V_{TH}$, the voltage detecting circuit 102 determines that there is a battery residual quantity available and outputs a high-level voltage as a detected result to an output terminal OUT. Conversely, when the input voltage $V_{BAT}$ is lower than the detection threshold value voltage $V_{TH}$, the voltage detecting circuit 102 determines that there is no battery residual quantity available and outputs a low-level voltage as a detected result to the output terminal OUT. The output terminal OUT is connected to other electronic components (not shown in the figure) which are included in the battery using equipment.

The voltage detecting circuit 102 includes a threshold value voltage generator 112 that selectively generates different threshold value voltages (high-side and low-side) depending on whether the input voltage $V_{BAT}$ increases (changes from low voltage to high voltage) or whether the input voltage $V_{BAT}$ drops (changes from high voltage to low voltage), a comparator 111 that compares this threshold value voltage (detection threshold value voltage $V_{TH}$) with the input voltage $V_{BAT}$, an inverter 124 that inverts the output of the comparator 111, an output switching element 113 that receives the output of the inverter 124 and outputs the voltage detection result from the output terminal OUT, and a reference voltage generator (REF) 114 that generates a reference voltage $V_{REF}$. The output of the inverter 124 is also used for selecting one of the two threshold value voltages in the threshold value voltage generator 112. The reference voltage $V_{REF}$ is used as a reference for these threshold value voltages.

The threshold value voltage generator 112 and comparator 111 achieve hysteresis of the input voltage detection. By virtue of this achievement, when the input voltage $V_{BAT}$ approximates the detection threshold value voltage $V_{TH}$, the repeated turning ON and OFF o the output switching element 113 caused by minute levels of noise resulting in instability of the output of the output terminal OUT is prevented.

The battery device 101 selects the high-side threshold value voltage when the input voltage $V_{BAT}$ increases and selects the low-side threshold value voltage when the input voltage $V_{BAT}$ drops. Accordingly, when the battery 103 is removed, as the input voltage $V_{BAT}$ drops, the low-side threshold value voltage is set as the detection threshold value voltage $V_{TH}$. When the battery 103 is then reinserted, as the input voltage $V_{BAT}$ increases, the high-side threshold value voltage is set.

FIG. 5 shows the relationship between the input voltage $V_{BAT}$ and the detection threshold value voltage $V_{TH}$. The figure shows a case in which there is only a little residual battery quantity available, that is, a case in which the battery voltage has gradually dropped from a state in which the input voltage $V_{BAT}$ exceeds a high-side threshold value voltage (for example, 2.9V) in the initial usage period of the battery 103 to a state in which the input voltage $V_{BAT}$ is a voltage (for example 2.6V) between the high-side threshold value voltage and a low-side threshold value voltage (for example 2.5V). When the battery 103 is removed and the input voltage $V_{BAT}$ drops and intersects the low-side threshold value voltage, the output terminal OUT switches from the high level to the low level and the detection threshold value voltage $V_{TH}$ is set to the high-side threshold value voltage. When the battery 103 is then reinserted subsequent to the input voltage $V_{BAT}$ having reached the ground potential (0V), the input voltage $V_{BAT}$ increases and exceeds the low-side threshold value voltage value. However, it does not reach and does not intersect with the high-side threshold value voltage and, as a result, the output terminal OUT remains at the low level. Accordingly, while the battery using equipment operates as if residual battery quantity is available until the battery 103 is removed, when the battery 103 is temporarily removed and then reinserted, a phenomenon is established in which there is a state of no residual quantity of the battery 103 available, which prevents the battery using equipment from starting up. This precludes the battery using equipment from being able to be used to the limit of the available residual quantity of the battery 103 and reduces the usable life of the battery.

SUMMARY OF THE INVENTION

In order to overcome the problems described above, preferred embodiments of the present invention provide a voltage detecting circuit in which a battery assembled in battery using equipment can be used up to its usage limit, and to a battery device using this circuit.

A voltage detecting circuit according to a preferred embodiment of the present invention includes an input voltage comparing circuit that controls the opening and closing of an output switching element in response to an output of the comparison of a first threshold value voltage or a second threshold value voltage lower than the first threshold value voltage with an input voltage, and selects the second threshold value voltage when the input voltage changes from a low voltage to a high voltage and intersects the first threshold value voltage, and selects the first threshold value voltage when the input voltage changes from the high voltage to the low voltage and intersects the second threshold value voltage; and a threshold value voltage setting circuit that compares a third threshold value voltage lower than the second threshold value voltage with the input voltage and, when the input voltage changes from a low voltage to a high voltage and intersects the third threshold value voltage, outputs a pulse for a predetermined period thereafter so that the second threshold value is selected in the input voltage comparing circuit, the second threshold value voltage being compared with the input voltage in the input voltage comparing circuit when the input voltage increases.

It is preferable that the threshold value voltage setting circuit selects a fourth threshold value voltage lower than the third threshold value voltage when the input voltage changes from a low voltage to a high voltage and intersects the third threshold value voltage, and that the threshold value voltage setting circuit selects the third threshold value voltage when the input voltage changes from a high voltage to a low voltage and intersects the fourth threshold value voltage.

The battery device according to another preferred embodiment of the present invention includes the above-described voltage detecting circuit, series-connected resistors having one end grounded and for generating the input voltage of the voltage detecting circuit, and a battery that is connected to the other end of the series-connected resistors.

According to the preferred embodiments of the present invention, because the voltage detecting circuit and battery device using this circuit use a third threshold value voltage lower than a first threshold value voltage and second threshold value voltage and, when the input voltage increases and reaches the third threshold value voltage, a threshold value voltage setting circuit sets in the input voltage comparing circuit the second threshold value voltage, a battery assembled in battery using equipment can be used up to its usage limit.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
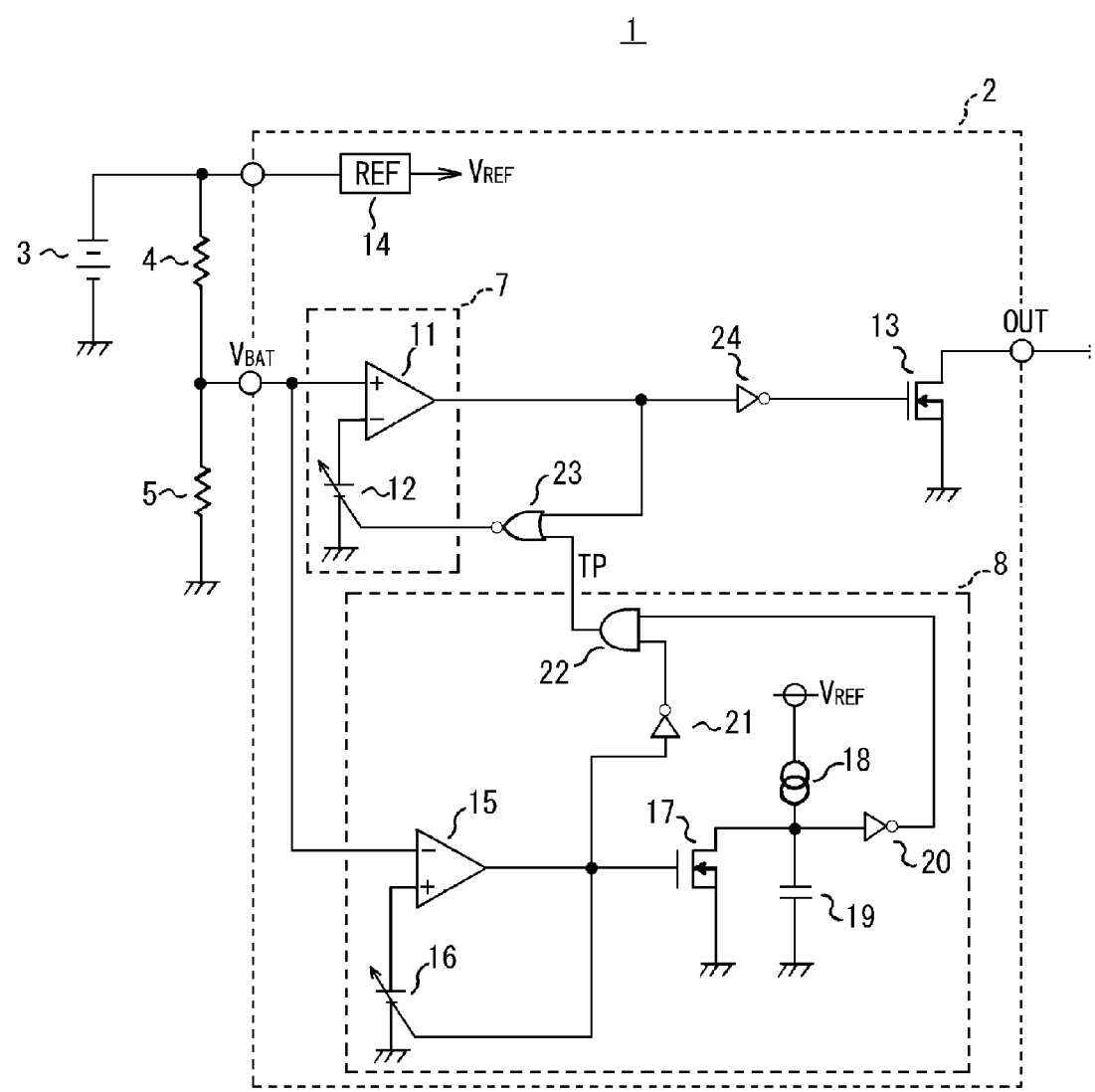
FIG. 1 is a circuit diagram of the voltage detecting circuit according to a preferred embodiment of the present invention and battery device using the circuit.

The preferred embodiments of the present invention will be hereinafter described with reference to the drawings. FIG. 1 is a circuit diagram of the voltage detecting circuit 2 according to a preferred embodiment of the present invention and a battery device 1 using the circuit.

The battery device 1 includes a voltage detecting circuit 2; series-connected resistors 4, 5, having one end grounded, for generating an input voltage $V_{BAT}$ of the voltage detecting circuit 2; and a battery 3 connected to the other end of the series-connected resistors 4, 5 which serves as the power source of the battery using equipment. The voltage of the battery 3 is divided by the series-connected resistors 4, 5, and this divided voltage is input as the input voltage $V_{BAT}$ to the voltage detecting circuit 2. The voltage detecting circuit 2 compares the input voltage $V_{BAT}$ with a detection threshold value voltage $V_{TH}$. When the input voltage $V_{BAT}$ is higher than the detection threshold value voltage $V_{TH}$, the voltage detecting circuit 2 determines that there is a battery residual quantity available and outputs a high-level voltage as a detected result to an output terminal OUT. Conversely, when the input voltage $V_{BAT}$ is lower than the detection threshold value voltage $V_{TH}$, the voltage detecting circuit 2 determines that there is no battery residual quantity available and outputs a low-level voltage as a detected result to the output terminal OUT. The output terminal OUT is connected to other electronic components (not shown in the figure) which are included in the battery using equipment. The resistance value ratio, that is, the voltage-dividing ratio of the series-connected resistors 4, 5 is determined by the specification of the electronic components which are included in the battery using equipment. Resistance values are sufficiently large enough to minimize the direct current value.

The voltage detecting circuit 2 includes an input voltage comparing circuit 7 and threshold value voltage setting circuit 8. The input voltage comparing circuit 7, using as a detection threshold value voltage $V_{TH}$ a first threshold value voltage $V_{th1}$ or second threshold value voltage $V_{th2}$ lower than the first threshold value voltage $V_{th1}$, controls the opening and closing (ON and OFF) of an output switching element 13 in response to the output of the comparison of the detection threshold value voltage $V_{TH}$ with the input voltage $V_{BAT}$. As well, when the input voltage $V_{BAT}$ increases, that is, changes from a low voltage to a high voltage and intersects the first threshold value voltage $V_{th1}$, the input voltage comparing circuit 7 selects the second threshold value voltage $V_{th2}$ as the detection threshold value voltage $V_{TH}$, and when the input voltage $V_{BAT}$ drops, that is, changes from a high voltage to a low voltage and intersects the second threshold value voltage $V_{th2}$, it selects the first threshold value voltage $V_{th1}$ as the detection threshold value voltage $V_{TH}$. Accordingly, the input voltage comparing circuit 7 achieves hysteresis to the detection input voltage whereupon, when the input voltage approximates the detection threshold value voltage $V_{TH}$, the repeated turning ON and OFF of the output switching element 13 is prevented. Then, the instability of output of the output terminal OUT resulting in generation of short-circuit current or noise in the voltage detecting circuit 2 and the electronic components which are included in the battery using equipment is prevented. The output switching element 13 is an N-type MOS transistor of an open-drain configuration that is pulled up to any power source by a resistor (not shown in the figure) outside of the voltage detecting circuit 2. The output switching element 13 is not limited to an N-type MOS transistor and can be any other suitable switch.

The threshold value voltage setting circuit 8 compares a third threshold value voltage $V_{th3}$ lower than the second threshold value voltage $V_{th2}$ with the input voltage $V_{BAT}$ and, when the input voltage $V_{BAT}$ changes from a low voltage to a high voltage and intersects the third threshold value voltage $V_{th3}$, outputs a pulse for a predetermined period, to the input voltage comparing circuit 7 so that the second threshold value voltage $V_{th2}$ is forcibly selected in the input voltage comparing circuit 7. By virtue of this, when the input voltage $V_{BAT}$ increases from the ground potential, the second threshold value voltage $V_{th2}$ is compared with the input voltage $V_{BAT}$ in the input voltage comparing circuit 7.

Furthermore, when the input voltage $V_{BAT}$ changes from a low voltage to a high voltage and intersects the third threshold value voltage $V_{th3}$, the threshold value voltage setting circuit 8 selects a fourth threshold value voltage $V_{th4}$ lower than the third threshold value voltage $V_{th3}$, and when the input voltage $V_{BAT}$ changes from a high voltage to a low voltage and intersects the fourth threshold value voltage $V_{th4}$, it selects the third threshold value voltage $V_{th3}$. Accordingly, hysteresis is also achieved in the threshold value voltage setting circuit 8 and, when the input voltage $V_{BAT}$ approximates the third threshold value voltage $V_{th3}$, instability of the output of the threshold value voltage setting circuit 8 is prevented.

More specifically, the voltage detecting circuit 2 includes an inverter 24 that inverts the output of the input voltage comparing circuit 7, an output switching element 13 that is turned ON and OFF in accordance with the output of the inverter 24, a NOR circuit 23 that controls the input voltage comparing circuit 7 based on the output of the input voltage comparing circuit 7 and the output of the threshold value voltage setting circuit 8, and a reference voltage generator (REF) 14 into which the voltage of the battery 3 is directly input and that generates and outputs a reference voltage $V_{REF}$.

The input voltage comparing circuit 7 includes a threshold value voltage generator 12 that selectively generates a first or a second threshold value voltage as the detection threshold value voltage $V_{TH}$, and a comparator 11 that compares the detection threshold value voltage $V_{TH}$ input into an inversion input terminal with the input voltage $V_{BAT}$ input into a non-inversion input terminal.

Figure 2:
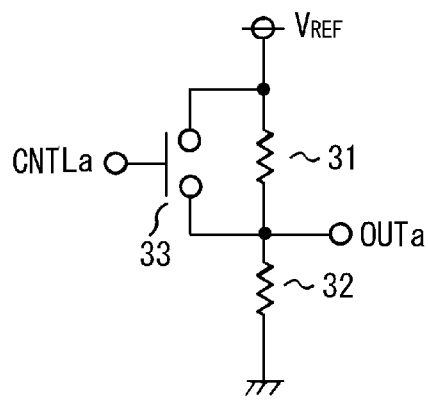
FIG. 2 is a circuit diagram of a threshold value voltage generator of FIG. 1.
Figure 2:
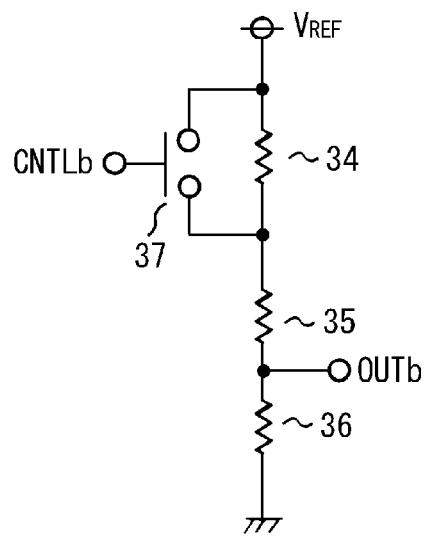

The threshold value voltage generator 12, as shown in FIG. 2, includes resistors 31, 32 connected in series between the reference voltage $V_{REF}$ and ground potential, and a switch 33 provided in parallel with the resistor 31 that is controlled by the input voltage of a terminal CNTLa. The connection point between the resistor 31 and the resistor 32 defines an output terminal OUTa that is connected with the inversion input terminal of the comparator 11. The terminal CNTLa is connected with the output of the NOR circuit 23 and is controlled by the output of the input voltage comparing circuit 7 and the threshold value voltage setting circuit 8 as described above. If the voltage of the terminal CNTLa is a high level, the switch 33 closes and the reference voltage $V_{REF}$ is output from the output terminal OUTa as the first threshold value voltage $V_{th1}$. If the voltage of the terminal CNTLa is a low level, the switch 33 opens and the voltage resulting from the voltage division of the reference voltage $V_{REF}$ by the resistor 31 and resistor 32 is output from the output terminal OUTa as the second threshold value voltage $V_{th2}$.

While hysteresis of the input voltage $V_{BAT}$ is achieved in the input voltage comparing circuit 7 by virtue of the threshold value voltage generator 12 and the comparator 11, hysteresis may be achieved by other circuit configurations.

The threshold value voltage setting circuit 8 includes a second threshold value voltage value generator 16 that selectively generates third and fourth threshold value voltages, a second comparator 15 that compares the third or fourth threshold value voltages input into the non-inversion input terminal with the input voltage $V_{BAT}$ input into the inversion input terminal, a switching element 17 into which the output of the second comparator 15 is input, a constant current source 18 that is connected at one end to the output of the switching element 17 and at the other end is connected to the reference voltage $V_{REF}$, a capacitor 19 that is connected at one end to the output of the switching element 17 and at the other end is connected to the ground potential, an inverter circuit 20 that inverts the output of the switching element 17, an inverter circuit 21 that inverts the output of the second comparator 15, and an AND circuit 22 that outputs a signal TP to an input terminal of the NOR circuit 23 based on the outputs of the inverter circuits 20, 21, as described above. Switching element 17 can be an N-type MOS transistor or any other suitable switch.

The switching element 17, constant current source 18, capacitor 19, and inverter 20 define a circuit that generates a delay (for example, 1 millisecond). This circuit may be replaced by a counter that generates a delay based on the input of a clock that serves as a reference. A pulse having a pulse width established by this delay is generated by the inverter 21, the AND circuit 22, and the circuit that generates the delay.

As shown in FIG. 2, the second threshold value voltage generator 16 includes resistors 34, 35, 36 connected in series between the reference voltage $V_{REF}$ and ground potential, and a switch 37 provided in parallel with the resistor 34 that is controlled by the input voltage of a terminal CNTLb. The connection point of the resistor 35 and resistor 36 serves as an output terminal OUTb and connects to the non-inversion input terminal of the second comparator 15. The terminal CNTLb is connected to the output of the second comparator 15. If the voltage of the terminal CNTLb is a high level, the switch 37 closes and the voltage obtained by the voltage-division of the reference voltage $V_{REF}$ by the resistor 35 and resistor 36 is output from the output terminal OUTb as the third threshold value voltage $V_{th3}$. If the voltage of the terminal CNTLb is a low level, the switch 37 opens and the voltage obtained by the voltage-division of the reference voltage $V_{REF}$ by the resistor 34 and resistor 35 connected in series and the resistor 36 is output from the output terminal OUTb as the fourth threshold value voltage $V_{th4}$.

As described above, achieving hysteresis by the threshold value voltage setting circuit 8 is preferable from the viewpoint of preventing instability of the output of the threshold value voltage setting circuit 8. However, because this output is not output to the exterior of the voltage detecting circuit 2, the extent of short-circuit current or noise generated as a result is not large. Accordingly, the omission thereof may be considered. In this case, the second threshold value voltage generator 16, in the absence of the resistor 34 and the terminal CNTLb shown in FIG. 2, outputs only the third threshold value voltage $V_{th3}$.

Figure 3:
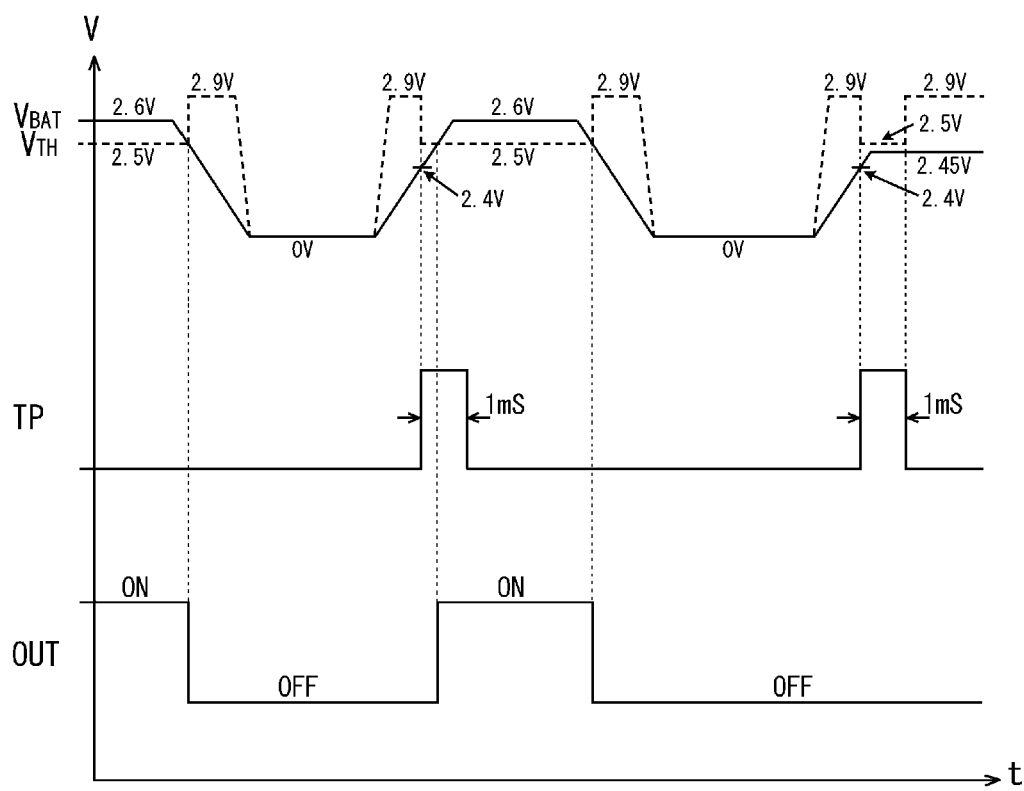
FIG. 3 is an operating waveform diagram of FIG. 1.
Figure 4:
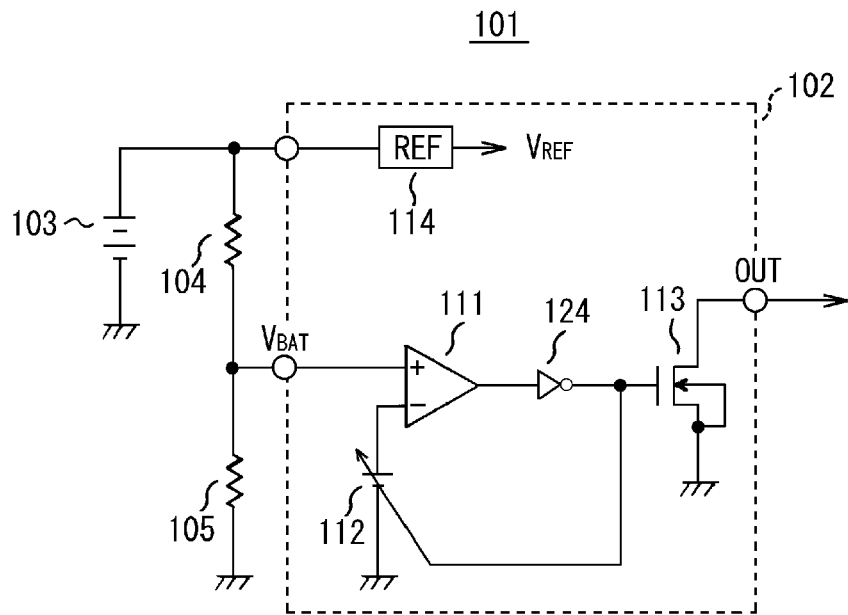
FIG. 4 is a circuit diagram of a conventional voltage detecting circuit and battery device using the circuit.
Figure 5:
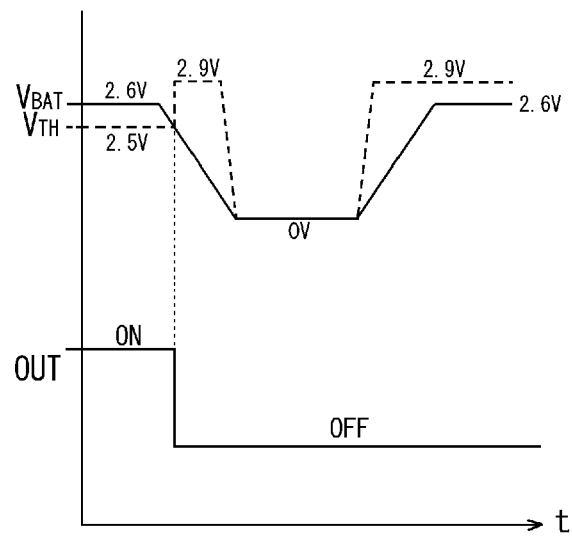
FIG. 5 is an operating waveform diagram of FIG. 4.

The operation of the voltage detecting circuit 2 will be described hereinafter with reference to FIG. 3 while specifically indicating examples of the voltage values. However, other voltage values may be used. When the input voltage $V_{BAT}$ (for example, 2.6V) is higher than the second threshold value voltage $V_{th2}$ (for example 2.5V) serving as the detection threshold value voltage $V_{TH}$, the output of the output terminal OUT is a high level and a residual quantity of the battery 3 is determined to be available. When the battery 3 is removed in this state, the input voltage $V_{BAT}$ drops. When the input voltage $V_{BAT}$ changes from a high voltage to a low voltage and intersects the second threshold value voltage $V_{th2}$ (for example 2.5V), the output voltage of the comparator 11 changes from a high level to a low level. Subsequently, the output switching element 13 is turned ON to establish the output terminal OUT at the low level and, in addition, the detection threshold value voltage $V_{TH}$ generated by the threshold value voltage generator 12 changes to the first threshold value voltage $V_{th1}$ (for example, 2.9V). Although not shown in the figure, when the input voltage $V_{BAT}$ drops and the input voltage $V_{BAT}$ changes from a high voltage to a low voltage and intersects the fourth threshold value voltage $V_{th4}$ (for example, 2.0V), the output voltage of the second comparator 15 changes from a low level to a high level and the threshold value voltage generated by second threshold value voltage generator 16 becomes the third threshold value voltage $V_{th3}$ (for example, 2.4V).

The operation of the voltage detecting circuit 2 when the input voltage $V_{BAT}$ increases from the ground potential as a result of reinserting the battery 3 will be hereinafter described. When the input voltage $V_{BAT}$ changes from a low voltage to a high voltage and intersects the third threshold value voltage $V_{th3}$ (for example 2.4V) generated by the second threshold value voltage generator 16, the output voltage of the second comparator 15 changes from a high level to a low level. Subsequently, the switching element 17 is turned OFF and, while the voltage of the capacitor 19 begins to gradually increase from the ground potential due to the current from the constant current source 18, the inverter 20 determines the input as a low level during the delay time (for example, 1 millisecond) determined from the values of the current from the constant current source 18 and the capacitance of the capacitor 19. Accordingly, because the inputs of the AND circuit 22 are both high level, the output TP of the AND circuit 22 is also a high level, while the output of the NOR circuit 23, irrespective of the other input, that is, the control signal from the input voltage comparing circuit 7, is a low level. As a result, the detection threshold value voltage $V_{TH}$ generated by the threshold value voltage generator 12 is the second threshold value voltage $V_{th2}$ (for example, 2.5V). Accompanying these operations, the threshold value voltage generated by the second threshold value voltage generator 16 changes to the fourth threshold value voltage $V_{th4}$ (for example, 2.0V).

When the input voltage $V_{BAT}$ further increases and the input voltage $V_{BAT}$ changes from a low voltage to a high voltage and intersects the second threshold value voltage $V_{th2}$ (for example 2.5V) during the period of the above delay time (for example, 1 millisecond), the output voltage of the comparator 11 changes from a low level to a high level. Subsequently, the output switching element 13 is turned OFF to establish the output terminal OUT at the high level. In addition, because the input to the NOR circuit 23 is a high level, even after the above delay time (for example, 1 millisecond) has elapsed, the detection threshold value voltage $V_{TH}$ generated by the threshold value voltage generator 12 remains as the second threshold value voltage $V_{th2}$ (for example, 2.5V). Accordingly, even if the input voltage $V_{BAT}$ is a lower voltage than the first threshold value voltage $V_{th1}$ (for example 2.9V), provided that the second threshold value voltage $V_{th2}$ (for example 2.5V) is exceeded, a battery residual quantity is determined as being available.

If the input voltage $V_{BAT}$ does not intersect the second threshold value voltage $V_{th2}$ (for example, 2.5V) during the period of the above delay time (for example, 1 millisecond) even if changing from a low voltage to a high voltage, the output TP of the AND circuit 22 is established at the low level and the output of the NOR circuit 23 is established at the high level, while the detection threshold value voltage $V_{TH}$ generated by the threshold value voltage generator 12 returns to the first threshold value voltage $V_{th1}$ (for example, 2.9V). The output voltage of the comparator 11 remains at a low level and, with the output terminal OUT unchanged at the low level, there is determined to be no residual battery quantity available. The right portion of FIG. 3 shows a state where the input voltage $V_{BAT}$ defines a voltage (for example, 2.45V) that has not reached the second threshold value voltage $V_{th2}$ (for example 2.5V) and there is determined to be no residual battery quantity available.

Although not shown in the figures, it is notable that the determination of no available battery residual quantity also includes those instances in which, in the end, even if the input voltage $V_{BAT}$ does reach the second threshold value voltage $V_{th2}$ (for example, 2.5V), the rise from the third threshold value voltage $V_{th3}$ (for example, 2.4V) to the second threshold value voltage $V_{th2}$ (for example, 2.5V) takes longer than the above delay time (for example, 1 millisecond). Accordingly, for this reason, to prevent the determination that there is no residual quantity available despite the battery residual quantity not having reached its usage limit, the above delay time must be determined in advance with consideration of the parasitic capacitance of the battery 3 and resistors 4 and 5 to be greater than the actual time taken from the third threshold value voltage $V_{th3}$ (for example, 2.4V) to the second threshold value voltage $V_{th2}$ (for example, 2.5V) when an appropriate battery residual quantity is available.

As described above, the voltage detecting circuit 2 according to the present preferred embodiment of the present invention, and the battery device 1 using this circuit, is provided with a third threshold value voltage $V_{th3}$ lower than first and second threshold value voltages $V_{th1}$, $V_{th2}$ and when the input voltage $V_{BAT}$ increases and reaches the third threshold value voltage $V_{th3}$ the threshold value voltage setting circuit 8 sets in the input voltage comparing circuit 7 the second threshold value voltage $V_{th2}$. Accordingly, even when the battery of only a little residual quantity available is temporarily removed and then reinserted, a phenomenon is established in which there is a state of no residual quantity of the battery available and in which the battery using equipment does not start up can be prevented. In this way, when the voltage detecting circuit 2 and the battery device 1 using this circuit are assembled in battery using equipment, the battery is able to be used until the usage limit and the useable life of the battery can be substantially extended.

The present invention is not restricted to the preferred embodiments described above and, within the scope of the items described in the claims, a range of modifications may be made thereto.

While the present invention has been described with respect to preferred embodiments thereof, it will be apparent to those skilled in the art that the disclosed invention may be modified in numerous ways and may assume many embodiments other than those specifically set out and described above.

What is claimed is:

1. A voltage detecting circuit comprising:
an output switching element;
a first comparator arranged to control the output switching element based on a comparison of an input voltage with a first threshold voltage value or a second threshold voltage value that is lower than the first threshold voltage value, the first threshold voltage value and the second threshold voltage value being selectively generated from a threshold voltage value generator;
a threshold voltage value setting circuit arranged to output a pulse signal based on a comparison of the input voltage with a third threshold voltage value that is lower than the second threshold voltage value; and
a logic circuit arranged to control the threshold voltage value generator based on the output of the first comparator; wherein
the logic circuit causes the threshold voltage value generator to generate the second threshold voltage value when the pulse signal is outputted.

2. The voltage detecting circuit according to claim 1, wherein
the threshold voltage value setting circuit comprises:
a second comparator arranged to compare the input voltage with the third threshold voltage value; and
a pulse generating circuit arranged to generate the pulse signal based on the output of the second comparator.

3. The voltage detecting circuit according to claim 2, wherein
the second comparator compares the input voltage with the third threshold voltage value or a fourth threshold voltage value that is lower than the third threshold voltage value, the third threshold voltage value and the fourth threshold voltage value being selectively generated based on the output of the second comparator.

4. A battery device comprising:
the voltage detecting circuit according to claim 1;
a plurality of series-connected resistors arranged to generate the input voltage of the voltage detecting circuit, the series-connected resistors having a grounded end; and
a battery connected to another end of the series-connected resistors.

* * * * *